(12) United States Patent
Takagishi et al.

(10) Patent No.: US 8,111,846 B2
(45) Date of Patent: Feb. 7, 2012

(54) LOW DISTORTION SWITCHING AMPLIFIER CIRCUITS AND METHODS

(75) Inventors: Hideto Takagishi, San Jose, CA (US); Wolf Zhang, Shanghai (CN); Alan Wu, Shanghai (CN)

(73) Assignee: PacificTech Microelectronics, Inc.

( * ) Notice: Subject to any disclaimer, the term of this patent is extended or adjusted under 35 U.S.C. 154(b) by 1009 days.

(21) Appl. No.: 11/890,813

(22) Filed: Aug. 7, 2007

(65) Prior Publication Data

US 2008/0161953 A1  Jul. 3, 2008

Related U.S. Application Data

(60) Provisional application No. 60/878,227, filed on Jan. 3, 2007.

(51) Int. Cl.
*H02B 1/00* (2006.01)

(52) U.S. Cl. .......... 381/123; 375/238; 332/109; 330/10

(58) Field of Classification Search .................. 381/123, 381/120, 96; 330/10; 375/238; 332/109
See application file for complete search history.

(56) References Cited

U.S. PATENT DOCUMENTS

| | | | |
|---|---|---|---|
| 5,161,185 A | 11/1992 | Hochschild | |
| 6,211,728 B1 | 4/2001 | Chen et al. | |
| 6,262,632 B1 | 7/2001 | Corsi et al. | |
| 6,414,863 B1 | 7/2002 | Bayer et al. | |
| 6,614,297 B2 | 9/2003 | Score et al. | |
| 6,683,494 B2 * | 1/2004 | Stanley | 330/10 |
| 6,693,571 B2 | 2/2004 | Melanson et al. | |
| 6,762,704 B1 | 7/2004 | Melanson et al. | |
| 6,791,405 B2 | 9/2004 | Tsuji et al. | |
| 6,917,324 B2 | 7/2005 | Lee | |
| 7,167,046 B2 | 1/2007 | Maejima | |
| 7,183,840 B2 | 2/2007 | Maejima | |
| 7,262,658 B2 | 8/2007 | Ramaswamy et al. | |
| 7,339,425 B2 | 3/2008 | Yang | |
| 7,378,904 B2 | 5/2008 | Risbo | |
| 7,482,870 B2 | 1/2009 | Maejima et al. | |
| 7,579,910 B2 | 8/2009 | Zhang et al. | |
| 7,737,776 B1 * | 6/2010 | Cyrusian | 330/10 |
| 2004/0232979 A1 * | 11/2004 | Edwards et al. | 330/10 |
| 2006/0181346 A1 | 8/2006 | Nguyen | |
| 2008/0101628 A1 | 5/2008 | Takagishi et al. | |
| 2008/0161953 A1 | 7/2008 | Takagishi | |
| 2011/0063027 A1 | 3/2011 | Kishii et al. | |

OTHER PUBLICATIONS

U.S. Appl. No. 12/985,556, filed Jan. 6, 2011, Takagishi.

* cited by examiner

*Primary Examiner* — Vivian Chin
*Assistant Examiner* — Con P Tran
(74) *Attorney, Agent, or Firm* — Chad W. Walsh; Fountainhead Law Group PC

(57) ABSTRACT

Embodiments of the present invention include switching amplifier circuits and methods. In one embodiment, the present invention includes a low distortion method of driving a switching amplifier comprising modulating an audio input signal to produce a half-wave rectified pulse-width modulated signal and a complementary half-wave rectified pulse-width modulated signal. These signals may be amplified in a power amplifier and combined in a feedback circuit to generate a first feedback signal and a second feedback signal, which may be coupled the inputs of a modulator for controlling the output signal.

16 Claims, 11 Drawing Sheets

100

200

LOW DISTORTION SWITCHING AMPLIFIER CIRCUITS AND METHODS

CROSS REFERENCE TO RELATED APPLICATIONS

This invention claims the benefit of priority from U.S. Provisional Application No. 60/878,227, filed Jan. 3, 2007, entitled "Low Distortion Switching Amplifier Circuits and Methods," the disclosure of which is hereby incorporated herein by reference.

BACKGROUND

The present invention relates to amplifiers, and in particular, to techniques for reducing distortion in switching amplifier circuits and methods.

A switching amplifier, sometimes referred to as a class D amplifier, is an amplifier where the output transistors are operated as switches. One example of a transistor used in switching amplifiers is a MOSFET. When the transistor is off, the circuit behaves like an open circuit so the current is zero. When the transistor is on, the voltage across the transistor is ideally zero. In practice, the voltage is very small. Since the equation for power is P=V*I, the power dissipated by the amplifier is very low in both states. This increases the efficiency, thus requiring less power from the power supply and allowing smaller heat sinks for the amplifier. For example, the increased efficiency translates into benefits such as longer battery life. The decrease in the size of the heat sinks lowers the weight, cost and size of the amplifier. Example applications where these advantages would be useful are portable battery-powered equipment such as cellular technology or portable music players.

FIG. 1 illustrates a block diagram of a switching amplifier 100. A continuous input signal is received by a modulator 101 and converted into a train of pulses. The input signal is transformed into a stream of pulses where the pulse characteristics are linked to the amplitude of the input signal. For example, within each period, the duty cycle of a pulse may be proportional to the amplitude of the input signal. For instance, if the input signal received is constant at zero, the duty cycle of the output pulses may be 50%. If the input signal received is highly positive, the duty cycle of the output pulses may be near 100%. Conversely, if the input signal received is highly negative, the duty cycle may be near 0%.

The modulated signal is then amplified in a switching output stage 102. Since the modulated signal is represented by a train of pulses, the output transistors operate like switches. This enables the transistors to have zero current when they are not switching and a low voltage drop across the transistors when they are switching.

The amplified signal generated by output stage 102 then enters a low pass filter 103 before entering a speaker 104. The low pass filter translates the modified amplified signal back into a continuous signal. A typical filter is an LC filter, for example. The resulting amplified continuous signal may be provided to a speaker and translated into sound. The benefits of low pass filters include minimizing electromagnetic interference ("EMI") in the amplified signal.

FIG. 2A illustrates the output stage of a typical class D circuit 200. A pulse width modulated signal is amplified by amplifier 201. Similarly, another pulse width modulated signal is amplified by amplifier 202. The amplifiers are coupled to speaker 203. As mentioned above, a filter may be included between the amplifiers and speaker to filter the waveform. The signals transmitted to the speaker are typically voltages and currents. The circuit illustrated in FIG. 2A is an open loop system and may experience distortion. Varying speaker impedance, power supply loading, and offsets due to power amplifier component mismatches are some of the factors which may influence distortion in an open loop system. The audio speaker is an electromechanical device which has input impedance which varies as the cone of the speaker is deflected through its range of motion, and if the amplifier does not compensate for the changing impedance, the resulting signal may contain distortion. Also, during bursts of sound, the amplifier power supply may droop causing the output signal to distort. Additionally, there may also be offsets between the positive and negative portions of the audio signal due to inherent mismatch of components within the power amplifier circuits, and this may cause distortion as well.

Another disadvantage of switching amplifiers is the crossover distortion that may appear in signals transmitted from the amplification stage. For example, crossover distortion in a differential system with the center point at zero volts will occur when the differential signal transitions from positive to negative voltages. However, the crossover point may occur at any voltage depending on system design. FIG. 2B illustrates waveforms within a switching amplifier. The input sinusoidal waveform is shown on plot 210. The crossover point in this example is the zero crossing of the sine wave is at 211. The peak of the sine wave, +v, is at 212 and the trough of the sine wave, −v, is at 213. Thus, the zero crossing is the transition point where the input signal transitions from a negative region of 0 to −v to a positive region of 0 to +v, or vice versa. Small signal pulses generated from modulator 101 of FIG. 1 surrounding the zero crossing may not be amplified in the output stage 102 of FIG. 1 due to the inherent transmission delay in the power amplifiers. Plots 220 and 230 illustrate the two amplified signals generated from the output stage for the two channels. Zone 250 illustrates the area surrounding zero crossing wherein small modulated pulses may not be translated by the output stage. For example, if the signal pulse received by the output stage was 5 ns and the transmission delay of the output stage is 10 ns, the 5 ns pulse will not be transmitted to the output terminal of the output stage. This will result in distortion. Plot 240 illustrates the signal generated by low pass filter 103 in FIG. 1. Due to the missing pulse widths in output signals 230 and 240, a point of discontinuity in the output waveform exists. This output distortion is illustrated by the flat area 241. This discontinuity, also known as crossover distortion, may increase the total harmonic distortion and noise of the output signal.

Thus, there is a need for switching amplifier feedback in low distortion systems. The present invention solves these and other problems by providing switching amplifier feedback circuits and methods.

SUMMARY

Embodiments of the present invention include switching amplifier circuits and methods. In one embodiment the present invention includes a method of controlling the output of a modulation circuit comprising, modulating an audio input signal to produce a half-wave rectified pulse-width modulated signal and a complementary half-wave rectified pulse-width modulated signal, amplifying the half-wave rectified pulse-width modulated signal to produce an amplified half-wave rectified pulse-width modulated signal, amplifying the complementary half-wave rectified pulse-width modulated signal to produce an amplified complementary half-wave rectified pulse-width modulated signal, combining the amplified half-wave rectified pulse-width modulated signal with an inverse of the amplified complementary half-wave rectified pulse-width modulated signal to generate a first feedback signal, and combining the amplified complementary half-wave rectified pulse-width modulated signal with an inverse of the amplified half-wave rectified pulse-width modulated signal to generate a second feedback signal, coupling the first feedback signal to a first input of the modulator and coupling the second feedback signal to a second input of the modulator.

In one embodiment the present invention the inverse of the amplified half-wave rectified pulse-width modulated signal is generated by inverting the half-wave rectified pulse-width modulated signal and the inverse of the amplified complimentary half-wave rectified pulse-width modulated signal is generated by inverting the complimentary half-wave rectified pulse-width modulated signal.

In one embodiment the present invention the inverse of the amplified half-wave rectified pulse-width modulated signal is generated by inverting the amplified half-wave rectified pulse-width modulated signal and the inverse of the amplified complimentary half-wave rectified pulse-width modulated signal is generated by inverting the amplified complimentary half-wave rectified pulse-width modulated signal In one embodiment, the present invention further comprises coupling the amplified half-wave rectified pulse-width modulated signal, through a first integrated circuit package terminal, to a first terminal of a speaker and coupling the amplified complementary half-wave rectified pulse-width modulated signal, through a second integrated circuit package terminal, to a second terminal of a speaker.

In one embodiment the present invention the audio input signal is a differential signal.

In one embodiment, the present invention includes an electronic circuit comprising a modulator having a first input for receiving an audio signal, a second input for receiving an audio signal, a first output for providing a half-wave rectified pulse-width modulated signal, and a second output for providing a complementary half-wave rectified pulse-width modulated signal, a first amplifier having a first input coupled to the first output of the modulator and a first output for providing an amplified half-wave rectified pulse-width modulated signal, a second amplifier having a first input coupled to the second output of the modulator and a first output for providing an amplified complementary half-wave rectified pulse-width modulated signal, and a feedback circuit having at least one input coupled to the first output of the first amplifier and at least one other input coupled to the first output of the second amplifier, the feedback circuit combining the amplified half-wave rectified pulse-width modulated signal with an inverse of the amplified complementary half-wave rectified pulse-width modulated signal to generate a first feedback signal on a first output, and combining the amplified complementary half-wave rectified pulse-width modulated signal to with an inverse of the amplified half-wave rectified pulse-width modulated signal to generate a second feedback signal on a second output.

In one embodiment the present invention the feedback circuit comprises a first resistor having a first terminal coupled to an intermediate node within the first amplifier which provides the inverse of the amplified half-wave rectified pulse-width modulated signal and having a second terminal coupled to the second input of the modulator, a second resistor having a first terminal coupled to the first output of the second amplifier which provides the amplified complimentary half-wave rectified pulse-width modulated signal and having a second terminal coupled to the second input of the modulator, a third resistor having a first terminal coupled to an intermediate node within the second amplifier which provides the inverse of the amplified complementary half-wave rectified pulse-width modulated signal and having a second terminal coupled to the first input of the modulator, and a fourth resistor having a first terminal coupled to the first output of the first amplifier which provides the amplified half-wave rectified pulse-width modulated signal and having a second terminal coupled to the first input of the modulator.

In one embodiment the present invention the feedback circuit comprises a first inverter having an input terminal coupled to the first output of the first amplifier which provides the amplified half-wave rectified pulse-width modulated signal and having an output terminal which provides the inverse of the amplified half-wave rectified pulse-width modulated signal, a second inverter having an input terminal coupled to the first output of the second amplifier which provides the amplified complimentary half-wave rectified pulse-width modulated signal and having an output terminal which provides the inverse of the amplified complimentary half-wave rectified pulse-width modulated signal, a first resistor having a first terminal coupled to the output of a first inverter and having the second terminal coupled to the second input of the modulator, a second resistor having a first terminal coupled to the first output of the second amplifier and having the second terminal coupled to the second input of the modulator, a third resistor having a first terminal coupled to the output of the second inverter and having the second terminal coupled to the first input of the modulator, and a fourth resistor having a first terminal coupled to the first output of the first amplifier and having the second terminal is coupled to the first input of the modulator In one embodiment the present invention the feedback circuit comprises a first current inverter having an input terminal and an output terminal, a second current inverter having an input terminal and an output terminal, a first resistor network having a first terminal coupled to the first output of the first amplifier which provides the amplified half-wave rectified pulse-width modulated signal and having a second terminal coupled to the input terminal of the first current inverter, a second resistor network having a first terminal coupled to the first output of the second amplifier which provides the amplified complementary half-wave rectified pulse-width modulated signal and having a second terminal coupled to the second input of the modulator and to the output terminal of the first current inverter, a third resistor network having a first terminal coupled to the first output of the second amplifier which provides the amplified complementary half-wave rectified pulse-width modulated signal and having a second terminal coupled to the input terminal of the second current inverter, and a fourth resistor network having a first terminal coupled to the first output of the first amplifier which provides the amplified complementary half-wave rectified pulse width modulated signal and having a second terminal coupled to the first input of the modulator and to the output terminal of the second current inverter.

In one embodiment the present invention the first resistor network comprises, a first resistor having a first terminal coupled to the first output of the first amplifier which provides the amplified half-wave rectified pulse-width modulated signal and having a second terminal, a second resistor having a first terminal coupled to the second terminal of the first resistor and having the second terminal coupled to a first reference voltage, and a third resistor having a first terminal coupled to the first terminal of the second resistor and the second terminal of the first resistor and having a second terminal coupled to the input terminal of the first current inverter.

In one embodiment the present invention the second resistor network comprises a first resistor having a first terminal coupled to the first output of the second amplifier which provides the amplified complementary half-wave rectified pulse-width modulated signal and having a second terminal coupled to the second input of the modulator, and a second resistor having a first terminal coupled to the second terminal of the first resistor and to the second input of the modulator and having a second terminal coupled to a first reference voltage.

In one embodiment the present invention the third resistor network comprises a first resistor having a first terminal coupled to the first output of the second amplifier which provides the amplified complementary half-wave rectified pulse-width modulated signal and having a second terminal, a second resistor having a first terminal coupled to the second terminal of the first resistor and having a second terminal coupled to a first reference voltage, and a third resistor having a first terminal coupled to the first terminal of the second resistor and the second terminal of the first resistor and having a second terminal coupled to the input of the second current inverter.

In one embodiment the present invention the fourth resistor network comprises a first resistor having a first terminal coupled to the first output of the first amplifier which provides the amplified half-wave rectified pulse-width modulated signal and having a second terminal coupled to the first input of the modulator, and a second resistor having a first terminal coupled to the second terminal of the first resistor and to the first input of the modulator and having a second terminal coupled to a first reference voltage.

In one embodiment the present invention wherein the first current inverter comprises a first transistor having a first terminal coupled to the second terminal of the first resistor network and having a control terminal coupled to the second terminal of the first resistor network, and having a second terminal coupled to ground, a second transistor having a first terminal, having a control terminal coupled to the control terminal of the first transistor, and having a second terminal coupled to ground, and a first resistor having a first terminal coupled to the first terminal of the second transistor and having a second terminal coupled to the second input of the modulator.

In one embodiment the present invention the second current inverter comprises a first transistor having a first terminal coupled to the second terminal of the third resistor network and having a control terminal coupled to the second terminal of the third resistor network, and having a second terminal coupled to ground, and a second transistor having a first terminal, having a control terminal coupled to the control terminal of the first transistor, and having a second terminal coupled to ground, and a first resistor having a first terminal coupled to the first terminal of the second transistor and having a second terminal coupled to the first input of the modulator.

In one embodiment the present invention the first output terminal is coupled to a first integrated circuit package terminal and the second output terminal is coupled to a second integrated circuit package terminal.

In one embodiment, the present invention includes a low distortion method of driving a switching amplifier comprising generating a first pulse width modulated signal on a first terminal, generating a second pulse width modulated signal on a second terminal, and delaying one of the first or second signals. In one embodiment, the modulated signals and delay result in pulse trains near zero crossings to reduce crossover distortion.

Additional embodiments will be evident from the following detailed description and accompanying drawings, which provide a better understanding of the nature and advantages of the present invention.

DETAILED DESCRIPTION

Described herein are techniques for feedback in switching amplifiers. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include obvious modifications and equivalents of the features and concepts described herein.

Figure 1:
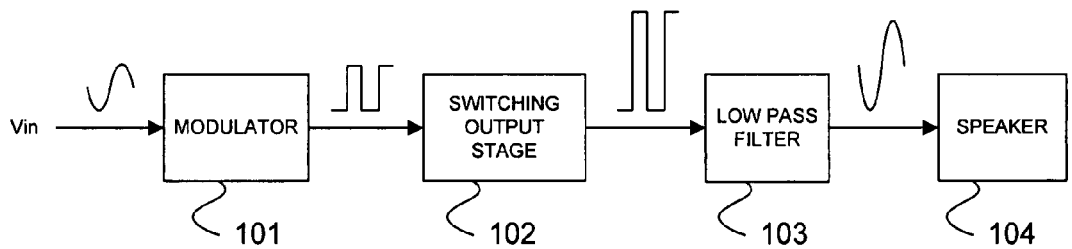
FIG. 1 illustrates a typical switching amplifier.
Figure 2A:
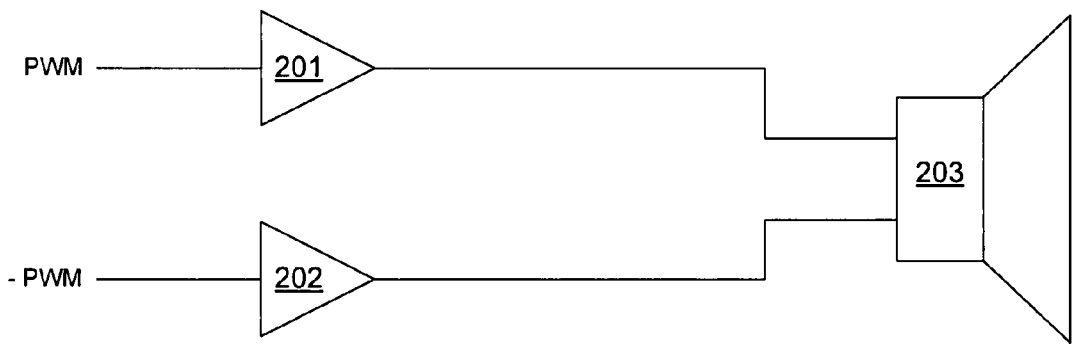
FIG. 2A illustrates an inductorless switching amplifier with no feedback.
Figure 2B:
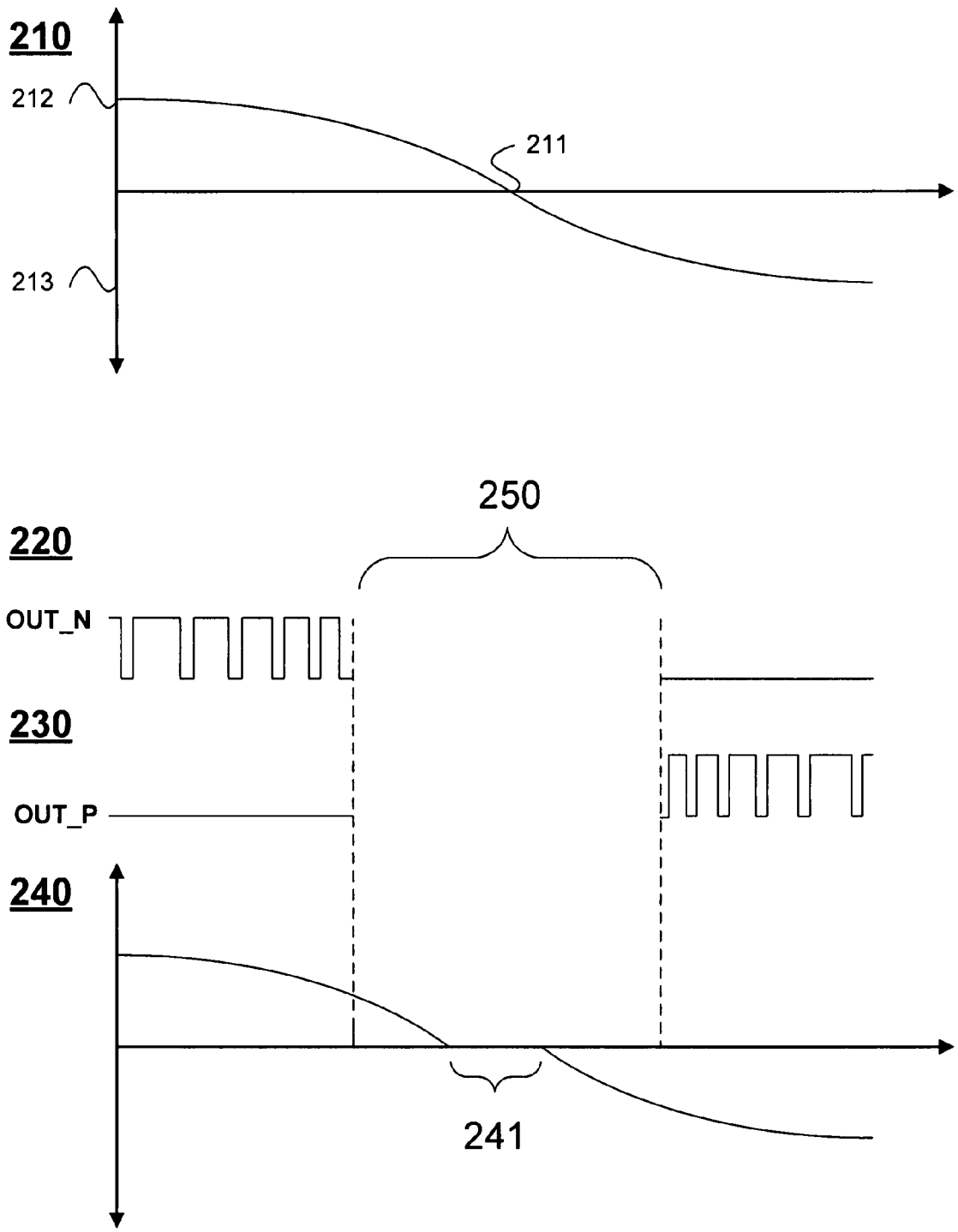
FIG. 2B illustrates a crossover distortion in a switching amplifier.
Figure 3:
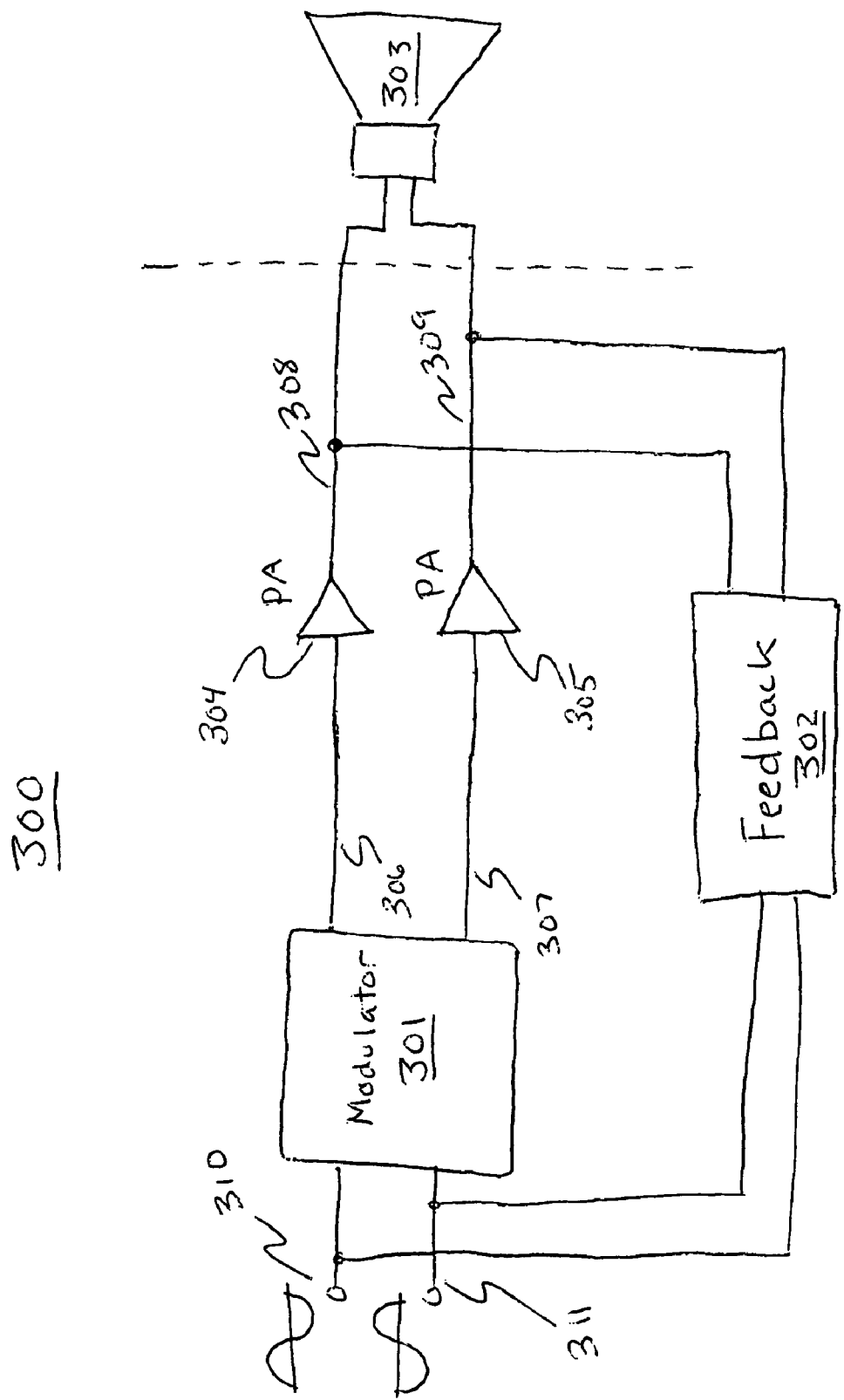
FIG. 3 illustrates a feedback scheme according to one embodiment of the present invention.

FIG. 3 illustrates a feedback scheme according to one embodiment of the present invention. Circuit 300 includes a modulator 301, a first amplifier 304, a second amplifier 305, a feedback circuit 302, and a speaker 303. An audio signal is presented to the modulator having a first input 310 for receiving an audio signal, and having a second input 311 for receiving an audio signal. The audio signal may be a differential signal. The audio signal may be a single ended signal which is applied to the first input 310 and inverted to apply to the second input 311. The modulator 301 modulates the audio signal to produce a half-wave rectified pulse-width modulated signal at a first output 306 of the modulator, and a complimentary half-wave rectified pulse-width modulated signal at a second output 307 of the modulator. The first output 306 of the modulator is coupled to the first input of the first amplifier 304 and first amplifier 304 amplifies the half-wave rectified pulse-width modulated signal to produce an amplified half-wave rectified pulse-width modulated signal on a first output 308 of the first amplifier. The second output 307 of the modulator is coupled to the first input of the second amplifier 305 and second amplifier 305 amplifies the complimentary half-wave rectified pulse-width modulated signal to produce an amplified complimentary half-wave rectified pulse-width modulated signal on a first output 309 of the second amplifier. The feedback circuit 302 has at least one input coupled to the first output 308 of the first amplifier 304, and at least one other input coupled to the second output 309 of the second amplifier 305. The feedback circuit 302 combines the amplified half-wave rectified pulse-width modulated signal with an inverse of the amplified complementary half-wave rectified pulse-width modulated signal to generate a first feedback signal, and combines the complementary half-wave rectified pulse-width modulated signal with an inverse of the amplified half-wave rectified pulse-width modulated signal to generate a second feedback signal. The first feedback signal is coupled to the first input of the modulator and the second feedback signal is coupled to the second input of the modulator.

The modulator 301, the first amplifier 304, the second amplifier 305, and the feedback circuit 302 may be integrated onto a single semiconductor chip and may include several integrated package terminals such as a first integrated circuit package input terminal which is coupled to the first input 310 for receiving an audio signal, a second integrated circuit package input terminal which is coupled to the second input 311 for receiving an audio signal, a first integrated circuit package output terminal which is coupled to the first output of the first amplifier 308, a second integrated circuit package output terminal which is coupled to the first output of the second amplifier 309, a integrated circuit package ground terminal used to provide a return current path for the integrated circuit, and a integrated circuit package power terminal used to provide input power to the integrated circuit. The first output of the first amplifier 304 may be coupled, through the first integrated package output terminal, to a first terminal of a speaker 303, and the first output of the second amplifier may be coupled, through the second integrated package output terminal, to a second terminal of the speaker 303.

Figure 4:
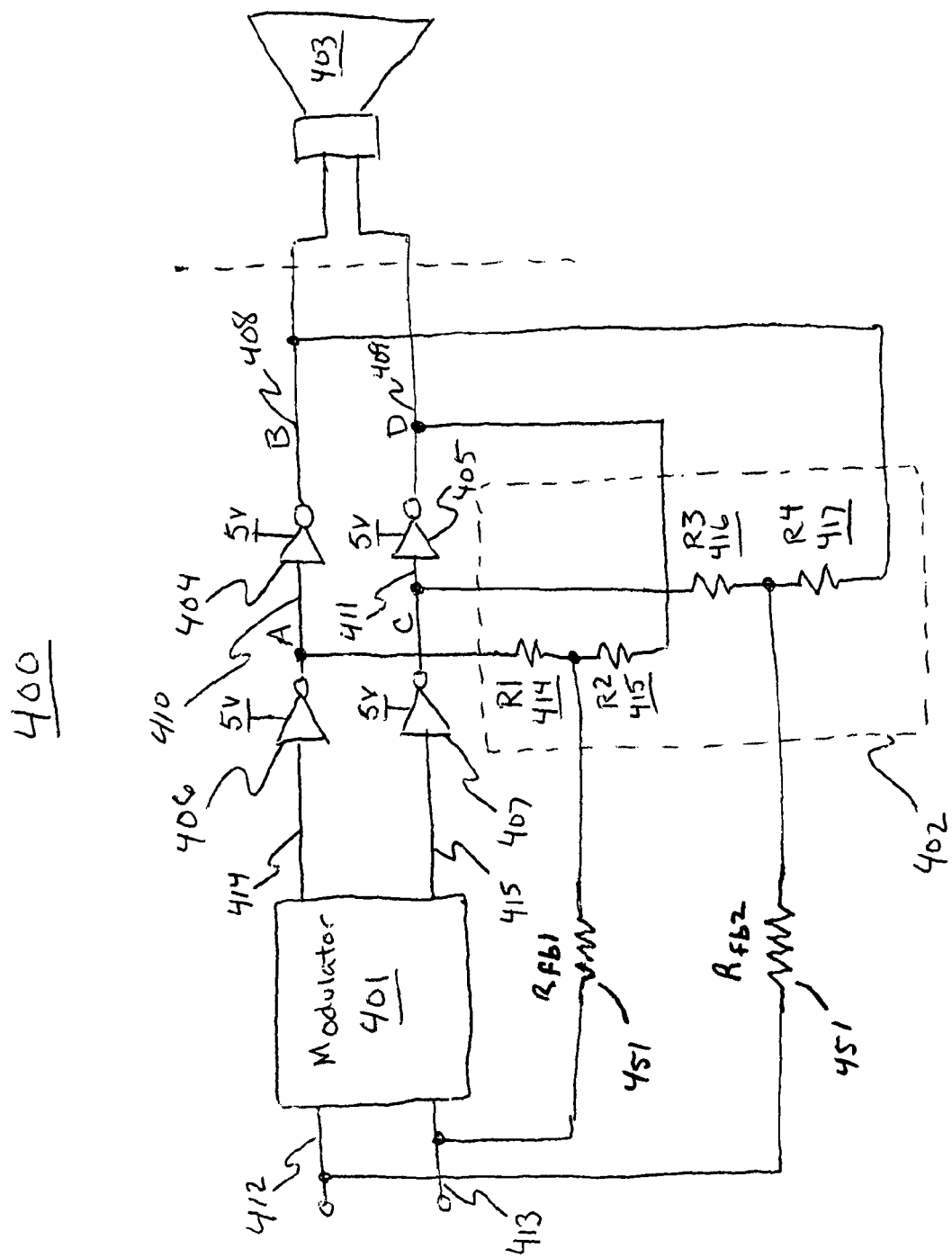
FIG. 4 illustrates a feedback scheme according to another embodiment of the present invention.

FIG. 4 illustrates a feedback scheme according to another embodiment of the present invention. Circuit 400 includes a modulator 401, a first amplifier having a first inverting stage 406 and a second inverting stage 404, a second amplifier having a first inverting stage 407 and a second inverting stage 405, a feedback circuit 402, and a speaker 403. An audio signal is presented to the modulator having a first input 412 for receiving an audio signal, and having a second input 413 for receiving an audio signal. The audio signal may be a differential signal and applied to the two inputs (412 and 413) or the audio signal may be a single ended audio signal applied to input 412 and then inverted and applied to input 413. The modulator 401 modulates the audio signal as mentioned above and generates a half-wave rectified pulse-width modulated signal on a first output 414 of the modulator and a complementary half-wave rectified pulse-width modulated signal on a second output 415. An example half-wave rectified pulse-width modulated signal. The first output of the modulator is coupled to a first input of the first inverting stage 406 of the first amplifier, and the second output of the modulator is coupled to a first input of the first inverting stage 407 of the second amplifier. A first output of the first inverting stage of the first amplifier is coupled to a first input of the second inverting stage of the first amplifier through an intermediate node 410 (node A) of the first amplifier, which provides the inverse of the half-wave rectified pulse-width modulated signal. A first output of the first inverting stage of the second amplifier is coupled to a first input of the second inverting stage of the second amplifier through an intermediate node 411 (node C) of the second amplifier, which provides the inverse of the complimentary half-wave rectified pulse width modulated signal. A first output of the second stage of the first amplifier is the output of the first amplifier and may be coupled to a first terminal of a speaker. A first output of the second stage of the second amplifier is the output of the second amplifier and may be coupled to a second terminal of the speaker.

The feedback circuit 402 includes first resistor 414, a second resistor 415, a third resistor 416, and a fourth resistor 417. The third resistor 416 has a first terminal coupled to an intermediate node 411 within the second amplifier and has a second terminal coupled to the first input 412 of the modulator. The fourth resistor 417 has a first terminal coupled to the first output 408 of the first amplifier and has a second terminal coupled to the first input 412 of the modulator. Resistors 416 and 417 combine the amplified half-wave rectified pulse-width modulated signal from the modulator with the inverse of the complementary half-wave rectified pulse-width modulated signal at intermediate node C to generate a first feedback signal and couples the first feedback signal to the first input of the modulator. The first resistor 414 has a first terminal coupled to an intermediate node 410 within the first amplifier and has a second terminal coupled to the second input 413 of the modulator. The second resistor 415 has a first terminal coupled to the first output of the second amplifier and has a second terminal coupled to the second input 413 of the modulator. Resistors 414 and 415 of the feedback circuit combine the amplified complimentary half-wave rectified pulse-width modulated signal from the first output of the second amplifier with the inverse of the amplified half-wave rectified pulse-width modulated signal from the intermediate node A to generate a second feedback signal and couples the second feedback signal to the second input of the modulator. In this example, the feedback circuit may further include feedback resistors Rfb1 451 and Rfb2 450 for coupling the feedback signals into the feed forward path of the modulator.

Figure 5:
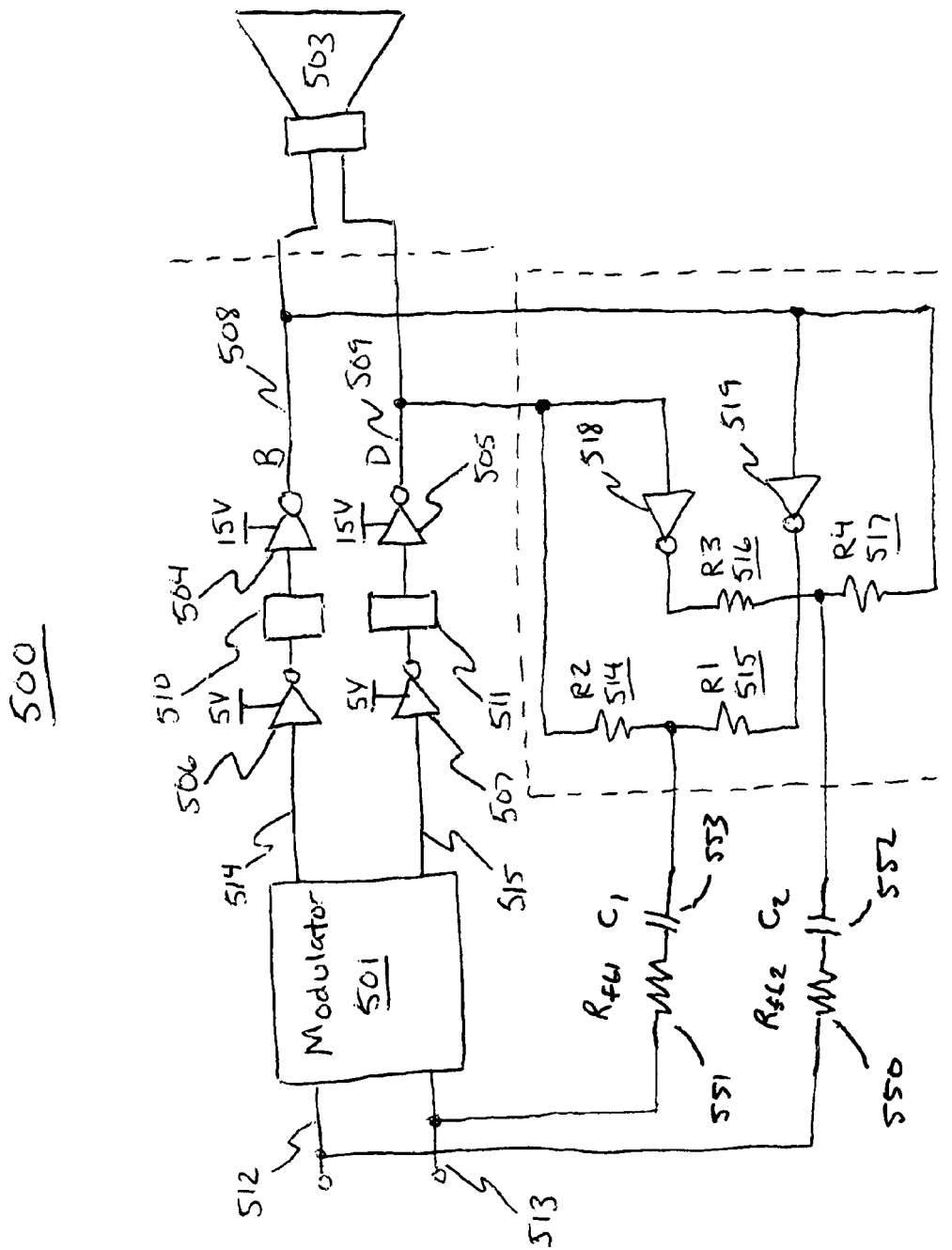
FIG. 5 illustrates a feedback scheme according to another embodiment of the present invention.

FIG. 5 illustrates a feedback scheme according to another embodiment of the present invention. Circuit 500 includes a modulator 501, a first amplifier having a first inverting stage 506, a level adjust circuit 510, and a second inverting stage 504, a second amplifier having a first inverting stage 507, a level adjust circuit 511, and a second inverting stage 505, a feedback circuit 502, and a speaker 503. An audio signal is presented to the modulator having a first input 512 for receiving an audio signal, and having a second input 513 for receiving an audio signal. The audio signal may be a differential signal and applied to the two inputs (512 and 513) or the audio signal may be a single ended audio signal applied to input 512 and then inverted and applied to input 513. The modulator 501 modulates the audio signal as mentioned above and generates a half-wave rectified pulse-width modulated signal on a first output 514 of the modulator and a complementary half-wave rectified pulse-width modulated signal on a second output 515. The first output of the modulator is coupled to a first input of the first inverting stage 506 of the first amplifier, and the second output of the modulator is coupled to a first input of the first inverting stage 507 of the second amplifier. The first inverting stage 506 of the first amplifier and the first inverting stage 507 of the second amplifier operate using a 5V supply and therefore have a high and low voltage swing between ground (0V) and 5V. A first output of the first inverting stage of the first amplifier is coupled to a first input of the second inverting stage of the first amplifier through an level adjust circuit 510 of the first amplifier which provides a voltage adjustment of the half-wave rectified pulse-width modulated signal. A first output of the first inverting stage of the second amplifier is coupled to a first input of the second inverting stage of the second amplifier through a level adjust circuit 511 of the second amplifier which provides a voltage adjustment to the inverse of the complimentary half-wave rectified pulse width modulated signal. The second inverting stage 504 of the first amplifier and the second inverting stage 505 of the second amplifier operate using a 15V supply and therefore have a high and low voltage swing between ground (0V) and 15V and make it necessary for the amplifier to adjust the input voltage levels of these second inverting stages. A first output of the second stage of the first amplifier is the output of the first amplifier and may be coupled to a first terminal of a speaker. A first output of the second stage of the second amplifier is the output of the second amplifier and may be coupled to a second terminal of the speaker. The outputs of the first and second amplifiers have voltage swing between ground (0V) and 15V. This may be advantageous for a design which wants to deliver more power to the speaker, but this design also makes it difficult to use an intermediate node to obtain the inverse of the necessary signals to construct a first feedback signal and a second feedback signal. This embodiment has a feedback circuit 502 which generates the inverse of the necessary signals from the amplified outputs by implementing two additional inverters.

The feedback circuit 502 includes a first inverter 519, a second inverter 518, a first resistor 515, a second resistor 514, a third resistor 516, and a fourth resistor 517. The second inverter 518 has an input terminal coupled to the first output of the second amplifier and has an output terminal which provides the inverse of the amplified complimentary half-wave rectified pulse-width modulated signal. The third resistor 516 has a first terminal coupled to the output of the second inverter 518 and has the second terminal coupled to the first input 512 of the modulator. The fourth resistor 517 has a first terminal coupled to the first output 508 of the first amplifier and has the second terminal is coupled to the first input 512 of the modulator. The second inverter, the third resistor, and the fourth resistor combine the half-wave rectified pulse-width modulated signal from the output of the first amplifier and the inverse of the amplified complimentary half-wave rectified pulse-width modulated signal from the first output of the second inverter to generate a first feedback signal and couples the first feedback signal to the first input of the modulator. The first inverter 519 has an input terminal coupled to the first output 508 of the first amplifier and has an output terminal which provides the inverse of the amplified half-wave rectified pulse-width modulated signal. The first resistor 515 has a first terminal coupled to the output of the first inverter 519 and has the second terminal coupled to the second input 513 of the modulator. The second resistor 514 has a first terminal coupled to the first output 509 of the second amplifier and has the second terminal is coupled to the second input 513 of the modulator. The first inverter, the first resistor, and the second resistor combine the amplified complimentary half-wave rectified pulse-width modulated signal with the inverse of the amplified half-wave rectified pulse-width modulated signal from the first output of the first amplifier to generate a second feedback signal and couples the second feedback signal to the second input of the modulator. In this example, the feedback circuit may further include feedback resistors Rfb1 551 and Rfb2 550 for coupling the feedback signals into the feed forward path of the modulator. Additionally, this example may include DC coupling capacitors C1 552 and C2 552 for coupling feedback signals between output DC voltage levels and the DC voltage levels of the modulator feed forward path.

Figure 6:
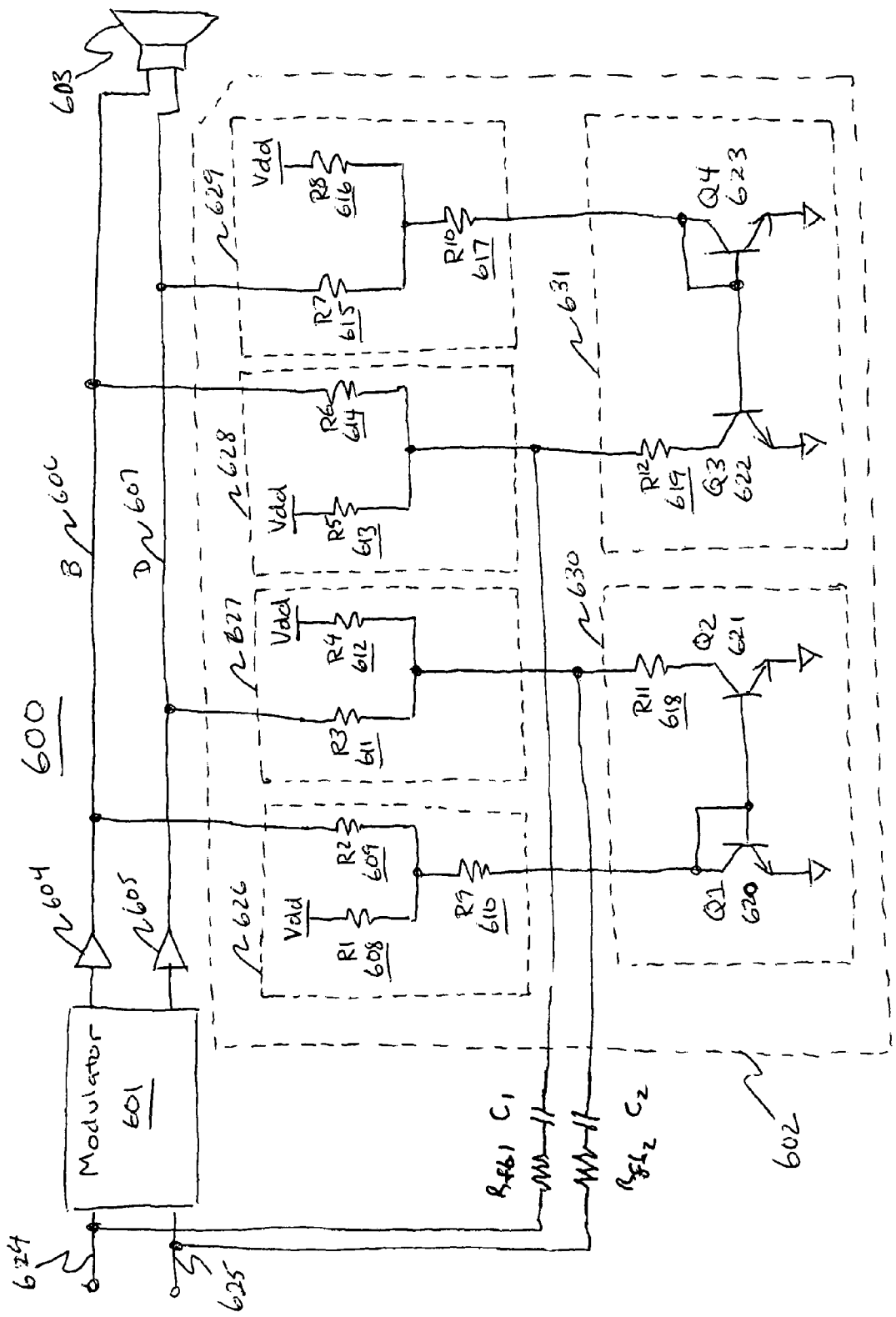
FIG. 6 illustrates a feedback scheme according to another embodiment of the present invention.

FIG. 6 illustrates a feedback scheme according to another embodiment of the present invention. Circuit 600 includes a modulator 601, a first amplifier 604, a second amplifier 605, a feedback circuit 602, and a speaker 603. An audio signal is presented to the modulator having a first input 624 for receiving an audio signal, and having a second input 625 for receiving an audio signal. The audio signal may be a differential signal and applied to the two inputs (624 and 625) or the audio signal may be a single ended audio signal applied to input 624 and then inverted and applied to input 625. The modulator 601 modulates the audio signal as mentioned above. A first output of the first amplifier may be coupled to a first terminal of a speaker. A first output of the second amplifier may be coupled to a second terminal of the speaker. This embodiment has a feedback circuit 602 which generates the inverse of the necessary signals from the amplified outputs by implementing a current mode circuit including two current inverters.

The feedback circuit 602 includes a first current inverter 630, a second current inverter 631, a first resistor network 626, a second resistor network 627, a third resistor network 629, and a fourth resistor network 628. The third resistor network, the fourth resistor network, and the second current inverter are used to combine the inverse of the amplified complimentary half-wave rectified pulse-width modulated signal with the amplified half-wave rectified pulse-width modulated signal and this process results in a first feedback signal which is coupled to the first input 624 of the modulator 601. The first resistor network, the second resistor network, and the first current inverter are used to combine the inverse of the amplified half-wave rectified pulse-width modulated signal with the amplified complimentary half-wave rectified pulse-width modulated and this process results in a second feedback signal which is coupled to the second input 625 of the modulator 601.

The first resistor network 626 may include a first resistor 609 having a first terminal coupled to the first output of the first amplifier which provides the amplified half-wave rectified pulse-width modulated signal and having a second terminal. The network 626 may further include a second resistor 608 having a first terminal coupled to the second terminal of the first resistor and having the second terminal coupled to a first reference voltage ("Vdd"). The network 626 may further include a third resistor 610 having a first terminal coupled to the first terminal of the second resistor and the second terminal of the first resistor and having a second terminal coupled to the input of the first current inverter 630.

The second resistor network 627 may include a first resistor 611 having a first terminal coupled to the first output of the second amplifier which provides the amplified complimentary half-wave rectified pulse-width modulated signal and having a second terminal coupled to the second input of the modulator. The network 627 may further include a second resistor 612 having a first terminal coupled to the second terminal of the first resistor and to the second input of the modulator and having a second terminal coupled to a first reference voltage.

The third resistor network 629 may include a first resistor 615 having a first terminal coupled to the first output of the second amplifier which provides the amplified complimentary half-wave rectified pulse-width modulated signal and having a second terminal. The network 629 may further include a second resistor 616 having a first terminal coupled to the second terminal of the first resistor and having a second terminal coupled to a first reference voltage. The network may further include a third resistor 617 having a first terminal coupled to the first terminal of the second resistor and the second terminal of the first resistor and having a second terminal coupled to the input of the second current inverter.

The fourth resistor network 628 may include a first resistor 614 having a first terminal coupled to the first output of the first amplifier which provides the amplified half-wave rectified pulse-width modulated signal and having a second terminal coupled to the first input of the modulator. The network may further include a second resistor 613 having a first terminal coupled to the second terminal of the first resistor and to the first input of the modulator and having a second terminal coupled to a first reference voltage.

The first current inverter 630 may include a first transistor 620 having a first terminal coupled to the second terminal of the first resistor network and having a control terminal coupled to the second terminal of the first resistor network, and having a second terminal coupled to ground. The inverter 630 may further include a second transistor 621 having a first terminal, having a control terminal coupled to the control terminal of the first transistor, and having a second terminal coupled to ground. The inverter 630 may further include a first resistor 618 having a first terminal coupled to the first terminal of the second transistor and having a second terminal coupled to the second input of the modulator.

The second current inverter 623 may include a first transistor 623 having a first terminal coupled to the second terminal of the third resistor network and having a control terminal coupled to the second terminal of the third resistor network, and having a second terminal coupled to ground. The inverter may further include a second transistor 622 having a first terminal, having a control terminal coupled to the control terminal of the first transistor, and having a second terminal coupled to ground. The network may further include a first resistor 619 having a first terminal coupled to the first terminal of the second transistor and having a second terminal coupled to the first input of the modulator.

In this example, the feedback circuit may further include feedback resistors Rfb1 and Rfb2 for coupling the feedback signals into the feed forward path of the modulator. Additionally, this example may include DC coupling capacitors C1 and C2 for coupling feedback signals between output DC voltage levels and the DC voltage levels of the modulator feed forward path.

Figure 7:
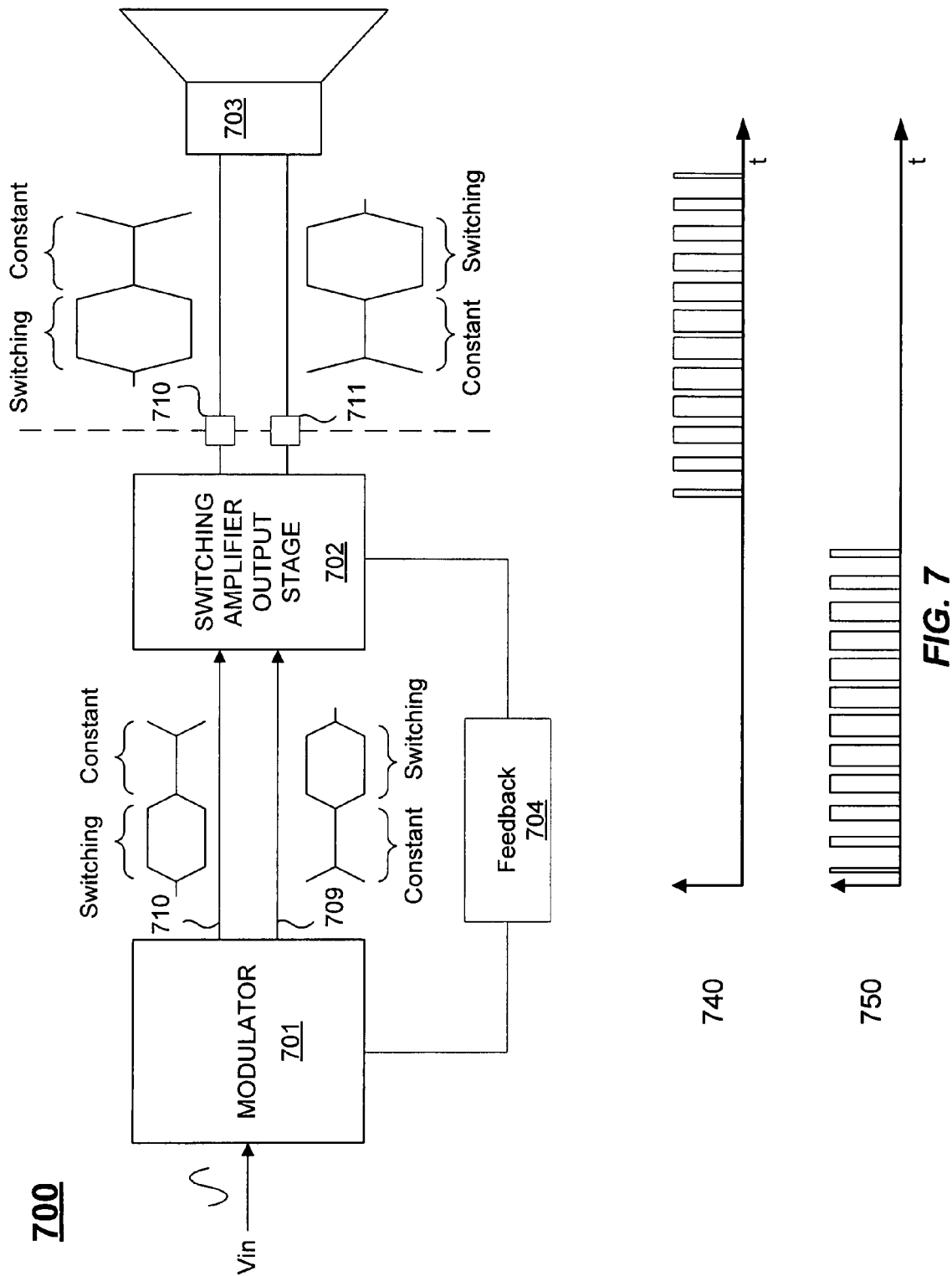
FIG. 7 illustrates a half-wave rectified pulse-width modulated signals according to another embodiment of the present invention.

FIG. 7 illustrates a half-wave rectified pulse-width modulated signals according to another embodiment of the present invention. Switching amplifier 70 is an electronic circuit that may be implemented using either discrete devices or as a fully integrated circuit on a single silicon die, for example. Circuit 700 includes a modulator 701 having one or more inputs for receiving an audio input signal (Vin). In one embodiment, modulator 701 receives a single ended signal. In other embodiments, modulator 701 may receive a differential audio signal. Modulator 701 translates the continuous time analog audio signal into a modulated signal. An example modulation schemes include pulse width modulation. However, other modulation techniques could be used. Modulator 701 includes two output terminals that carry first and second modulated signals. As illustrated in FIG. 7, the output of the modulator may operate differently during depending on the state of the input signals. For example, if the input signal increases, the modulation signal at terminal 708 may be held constant while the other modulation signal at terminal 709 switches (e.g., generates pulses or transitions between two voltages). Alternatively, if the input signal decreases, the modulation signal at terminal 709 may be held constant while the other modulation signal at terminal 708 switches. Accordingly, one embodiment of the present invention includes a modulation scheme wherein a first modulated signal is constant when a second modulated signal is switching, and the second modulated signal is constant when the first modulated signal is switching. The first modulation signal is referred to herein as the half-wave rectified pulse-width modulated signal and the second modulation signal is referred to herein as the complementary half-wave rectified pulse-width modulated signal. The half-wave rectified pulse-width modulated signal is illustrated at 750 and the complementary half-wave rectified pulse-width modulated signal is illustrated at 740.

The modulator output terminals 708 and 709 are coupled to the input terminals of a switching amplifier output stage 702. Amplifier 702 may receive the modulated signals and amplify the signals (e.g., the current) to drive a speaker 703, for example. Amplifier 702 may include output terminals for providing amplified modulated signals corresponding to the modulated signals received from modulator 701. If the circuits are implemented on an integrated circuit, the amplified modulated signals may be coupled from output terminals of the amplifier to integrated circuit package terminals 710 and 711 for example. The amplified modulated signals may also be provided to feedback circuit 704 to generate feedback signals as describe above. The dashed line represents the boundary between an integrated circuit and a printed circuit board, for example. The package terminals may, in turn, be coupled to a speaker. Therefore, if an audio input signals increases (e.g., above zero for an audio signal with no DC offset or above half-supply for an audio signal that is operating around half-supply), one terminal of the speaker (e.g., coupled to terminal 710) may be held constant while the other terminal of the speaker (e.g., coupled to terminal 711) receives the amplified modulated signal. Similarly, if the audio input signal decrease, the other terminal of the speaker (e.g., coupled to terminal 711) may be held constant while the opposite terminal of the speaker (e.g., coupled to terminal 710) receives the modulated signal. Based on the modulation techniques describe above, it can be seen that the first output terminal of the amplifier is constant (e.g., zero volts) when the second output terminal of the amplifier is switching, and the second output terminal of the amplifier is constant (e.g., zero volts) when the first output terminal of the amplifier is switching. When no input signal is received a very short pulse may appear on both positive and negative outputs (i.e. current through load is negligible), for example.

Further examples of half-wave rectified pulse-width modulated signals and switching systems are disclosed in U.S. patent application Ser. No. 11/588,799, entitled "Switching Amplifier Circuits and Methods, naming Hideto Takagishi as inventor the entire disclosure of which is incorporated herein by reference.

Figure 8:
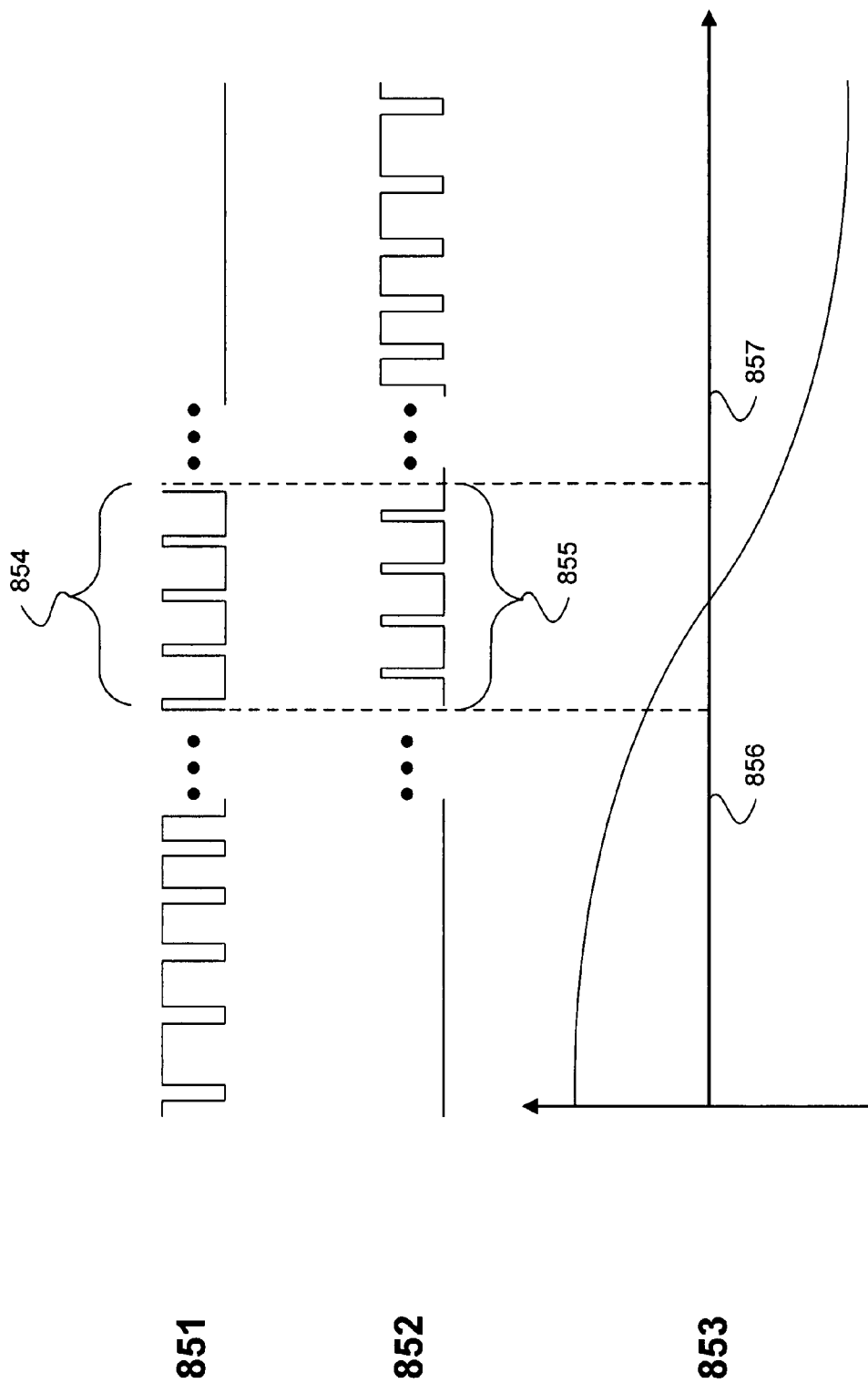
FIG. 8 illustrates a modulation scheme according to one embodiment of the present invention.

FIG. 8 illustrates a modulation scheme according to one embodiment of the present invention. An input analog audio signal is received by a modulator. In one embodiment, the modulator receives a single ended signal. In other embodiments, the modulator may receive a differential audio signal. The modulator translates the input signal into a modulated signal. An example modulation scheme includes pulse width modulation. However, other modulation techniques could be used. After modulation, the modulated signal is amplified by one or more amplifiers. During the amplification stage, small pulses within the modulated signal may be lost due to the inherent transmission delay of the amplifiers. Therefore, input signals of small amplitude may have to overcome crossover distortion when they are amplified by the power amplifiers. Plot 851 illustrates the output from a first channel of a two channel modulator while plot 852 illustrates the output from the second channel. A differential pulse train has been added on both channels near the crossover point as illustrated by 854 and 855. These pulses smooth out the transition at zero crossing, thus resulting in a decrease of total harmonic distortion and noise in the output signal. The idealized analog output signal is shown in plot 853. Because of the pulses, the modulated signal never goes to zero and the distortion surrounding the zero crossing is reduced. In other words, the crossover point is represented by equal duration pulses. The pulses on one output terminal are of equal duration and opposite polarity than the output pulses on the other output terminal at the crossover point. In this example, the pulses are also 180 degrees out of phase. In one embodiment, a delay circuit is used to delay one of the modulated signals so that the modulated representation of the input signal at the crossover point results in a pulses of equal duration on the first and second output terminals. The output terminals may be coupled to a speaker, for example, if the switching amplifier is used in an audio application. Of course, a variety of other applications may benefit from reduced crossover distortion.

Figure 9:
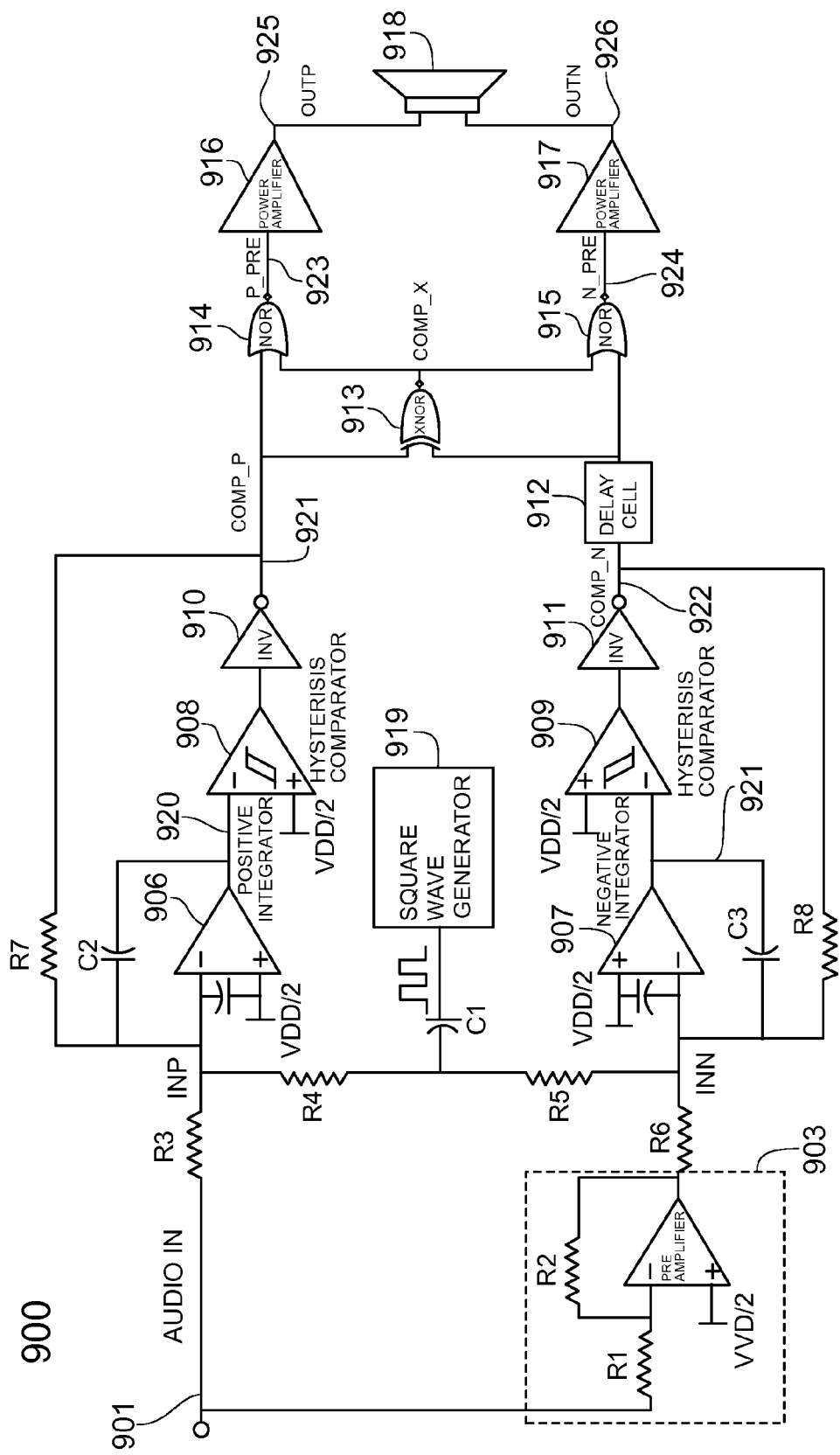
FIG. 9 illustrates a switching amplifier according to one embodiment of the present invention.

FIG. 9 illustrates a switching amplifier according to one embodiment of the present invention. The switching amplifier includes inverter circuit 903, integrators 906 and 907, comparators 908 and 909, square wave generator circuit 919, inverters 910 and 911, XNOR gate 913, NOR gates 914 and 915, delay cell 912, and power amplifiers 916 and 917.

An input analog signal 901 is received by circuit 900 and is transmitted to positive integrator 906 and inverter circuit 903. In this example, the input signal 901 is a single ended signal, and inverter circuit 903 may be used to produce an inverse of the input signal. In other embodiments of the present invention, the input signal may be a differential signal, in which case the inverter circuit may be omitted. In this example, the means for modulating the input signal includes two integrators 906 and 907, two comparators 908 and 909, and square wave generator 919. The output of the comparators is coupled through inverters 910 and 911 and a digital circuit. Here, the digital circuit comprised of XNOR 913 and NOR 914 and 915 is digitally half-wave rectifying the pulse width modulated signals to create a modulated representation of a half cycle of the audio signal. A modulated representation of a half cycle of the input signal, positive or negative, is referred to herein as a half-wave rectified modulated signal, or in the case of PWM a half-wave rectified, pulse width modulated signal. This example implementation further includes a delay cell 912 that delays one of the modulated signals so that the modulated signal at the output includes pulses having a minimum duration at the crossover point (e.g., the zero crossing). Accordingly, at the crossover point, the output signal will be pulses having a constant time period. In this example implementation, delay cell 912 is coupled between one of the comparator outputs and the digital circuit input.

Positive integrator 906 may receive the input signal and the output of the square wave generator circuit on the negative input terminal and generate a sawtooth waveform at node 920. The amplitude of the sawtooth waveform is determined by the hysteresis of the comparator 908 while the slope of the sawtooth is determined by the amplitude of the input signal. Hence, it may be said that the sawtooth waveform at node 920 is modulated by the input signal and comparator 908. The sawtooth waveform may then be transmitted to comparator 908 where the comparator performs a pulse width modulation by outputting a low value when the sawtooth waveform is above a certain upper threshold value and outputting a high value when the sawtooth is below a certain lower threshold value. The pulse width modulated signal is then inverted by inverter 910. Similarly, negative integrator 907 receives inverse input analog signal and the output of the square wave generator circuit on the negative input terminal. Integrator 907 receives these inputs and generates a sawtooth waveform at node 921. The sawtooth waveform is then received by comparator 909 wherein the waveform is pulse width modulated.

The pulse width modulated signals located at node 921 and 922 are received by digital circuit comprised of delay cell 912, XNOR 913, and NOR gates 914 and 915. The digital circuit translates the received signals into half-wave rectified, pulse width modulated signals. The signal at node 924 represents the half-wave rectified, pulse width modulated representation of the input analog signal, while the signal at node 923 represents the half-wave rectified, pulse width modulated representation of the inverted input analog signal. Delay cell 912 coupled to node 922 illustrates one method of generating a differential pulse train to reduce crossover distortion. Delay cell 912 delays the received signal by a fixed amount of time. When combined with the combination logic of the digital circuit, differential pulse trains may be generated at nodes 923 and 924 near zero crossing. The delay time results in a pulse train near zero crossings to reduce the crossover distortion near the zero crossing. This results in lower total harmonic distortion and noise in the speaker. In another embodiment, delay cell 912 is coupled between node 921 and NOR 914. The half-wave rectified, pulse width modulated signals are then received by power amplifiers 916 and 917 where the signals are amplified and transmitted to speaker 918.

Figure 10:
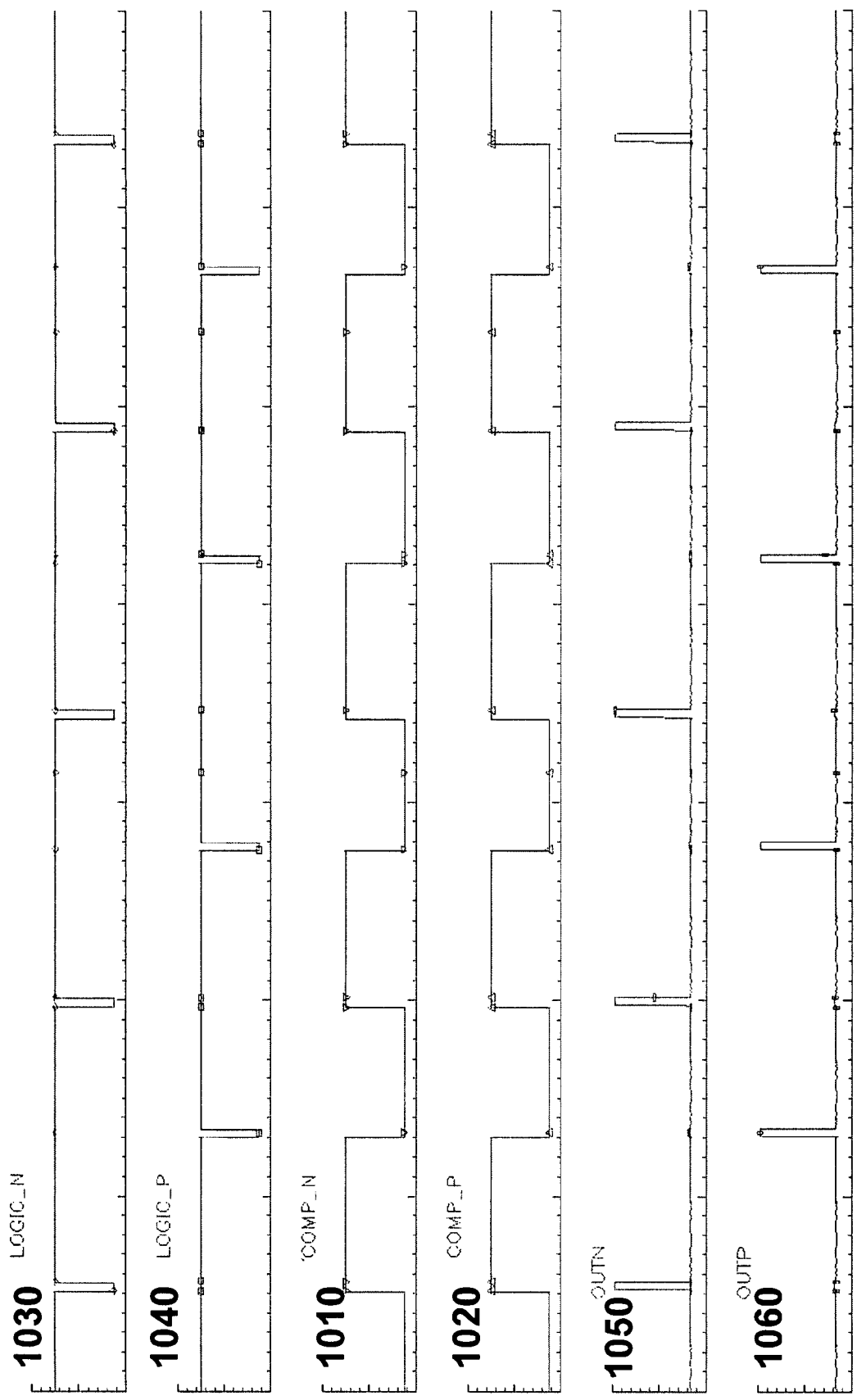
FIG. 10 illustrates waveforms in the switching amplifier of FIG. 9 when there is no input signal.

FIG. 10 illustrates waveforms in the switching amplifier of FIG. 9 when there is no input signal. Pulse width modulation of an empty input signal will result in a square waveform of 50 percent duty cycle. Plot 1010 illustrates the pulse width modulated signal located at node 922 of FIG. 9 while plot 1020 illustrates the pulse width modulated signal located at node 921 of FIG. 9. The two waveforms are identical, therefore the half-wave rectified, pulse width modulated signals received by the power amplifiers will also be flat if the delay cell was not present. With delay cell 912 of FIG. 9, plot 1010 shifts to the right by an amount equal to the fixed delay time of delay cell 912. This will result in differential fixed width pulse trains generated at nodes 923 and 924 of FIG. 9. These fixed width pulse trains may be generated whenever the incoming signal is near zero. Plot 1030 illustrates the waveform located at node 924 of FIG. 9 and plot 1040 illustrates the waveform located at node 923 of FIG. 9. Plot 1050 illustrates the amplified signal at node 926 and plot 1060 illustrates the amplified signal at node 925. When plots 1050 and 1060 are compared to plots 1030 and 1040 respectively, the waveforms are inverted copies of one another. This demonstrates that the pulse widths have in fact been translated by power amplifiers 916 and 917 of FIG. 9. These pulse trains may be used to drive the output whenever the input signal is near a crossover point.

Figure 11:
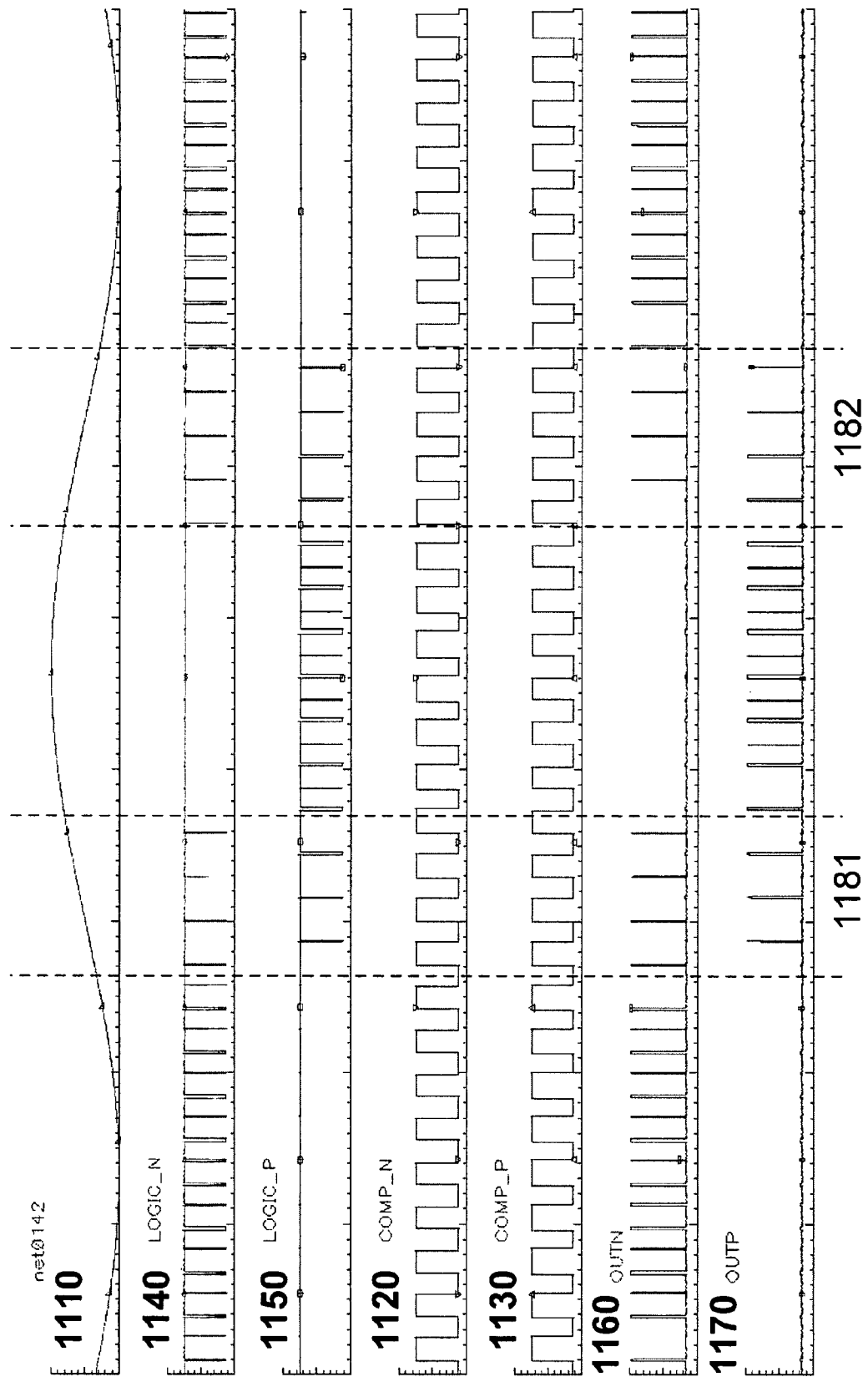
FIG. 11 illustrates waveforms in the switching amplifier of FIG. 9 when the input signal is a sine wave.

FIG. 11 illustrates waveforms in the switching amplifier of FIG. 9 when the input signal is a sine wave. The input signal is shown in plot 1110. Plot 1120 illustrates the pulse width modulated signal at node 922 of FIG. 9 and plot 1130 illustrates the pulse width modulated signal located at node 921 of FIG. 9. Combinational logic 913 through 915 of FIG. 9 is equivalent to the subtraction of the waveforms in plot 1120 and 1130. Node 923 is equivalent to the subtraction between plot 1130 and plot 1120 while node 924 is equivalent to the subtraction between plot 1120 and plot 1130. Near zero crossing, the subtraction may result in narrow pulse widths or no pulse widths at all. If the pulse widths are too narrow, they may not be translated by the power amplifier. The delay in delay cell 912 of FIG. 9 shifts plot 1120 to the right by a fixed amount. Accordingly, pulse widths near zero crossing may be set to a minimum duration sufficient to overcome the transition delay of the power amplifiers. Plot 1140 illustrates the half-wave rectified, pulse width modulated signal at node 924 and plot 1150 illustrates the half-wave rectified, pulse width modulated signal at node 923. Both plots contain pulse trains within the zero crossing zones illustrated by 1181 and 1182. Plot 1160 illustrates the waveform of plot 1140 after it is translated by power amplifier 917. As shown, the pulse trains within the zero crossing zone have been translated by the power amplifier. Similarly, plot 1170 illustrates the waveform of plot 1150 after it is translated by power amplifier 916. Here, the pulse trains within the zero crossing zone have also been translated by the power amplifier. The translation of those pulse widths by the power amplifier reduces the crossover distortion at zero crossing due to the transition delay of the power amplifier, therefore resulting in a decrease in the total harmonic distortion and noise in the circuit.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, switching amplifier circuits and methods according to the present invention may include some or all of the innovative features described above. Based on the above disclosure and the following claims, other arrangements, embodiments, implementations and equivalents will be evident to those skilled in the art and may be employed without departing from the spirit and scope of the invention as defined by the claims.

What is claimed is:

1. A method of controlling the output of a modulation circuit comprising:
   modulating an audio input signal to produce a half-wave rectified pulse-width modulated signal and a complementary half-wave rectified pulse-width modulated signal;
   amplifying the half-wave rectified pulse-width modulated signal to produce an amplified half-wave rectified pulse-width modulated signal;
   amplifying the complementary half-wave rectified pulse-width modulated signal to produce an amplified complementary half-wave rectified pulse-width modulated signal;
   combining the amplified half-wave rectified pulse-width modulated signal with an inverse of the amplified complementary half-wave rectified pulse-width modulated signal to generate a first feedback signal, and combining the amplified complementary half-wave rectified pulse-width modulated signal with an inverse of the amplified half-wave rectified pulse-width modulated signal to generate a second feedback signal;
   coupling the first feedback signal to a first input of the modulator and coupling the second feedback signal to a second input of the modulator.

2. The method of claim 1 wherein the inverse of the amplified half-wave rectified pulse-width modulated signal is generated by inverting the half-wave rectified pulse-width modulated signal and the inverse of the amplified complimentary half-wave rectified pulse-width modulated signal is generated by inverting the complimentary half-wave rectified pulse-width modulated signal.

3. The method of claim 1 wherein the inverse of the amplified half-wave rectified pulse-width modulated signal is generated by inverting the amplified half-wave rectified pulse-width modulated signal and the inverse of the amplified complimentary half-wave rectified pulse-width modulated signal is generated by inverting the amplified complimentary half-wave rectified pulse-width modulated signal.

4. The method of claim 1 further comprising:
   coupling the amplified half-wave rectified pulse-width modulated signal, through a first integrated circuit package terminal, to a first terminal of a speaker; and
   coupling the amplified complementary half-wave rectified pulse-width modulated signal, through a second integrated circuit package terminal, to a second terminal of a speaker.

5. The method of claim 1 wherein the audio input signal is a differential signal.

6. An electronic circuit comprising:
   a modulator having a first input for receiving an audio signal, a second input for receiving an audio signal, a first output for providing a half-wave rectified pulse-width modulated signal, and a second output for providing a complementary half-wave rectified pulse-width modulated signal;
   a first amplifier having a first input coupled to the first output of the modulator and a first output for providing an amplified half-wave rectified pulse-width modulated signal;
   a second amplifier having a first input coupled to the second output of the modulator and a first output for providing an amplified complementary half-wave rectified pulse-width modulated signal; and
   a feedback circuit having at least one input coupled to the first output of the first amplifier and at least one other input coupled to the first output of the second amplifier, the feedback circuit combining the amplified half-wave rectified pulse-width modulated signal with an inverse of the amplified complementary half-wave rectified pulse-width modulated signal to generate a first feedback signal on a first output, and combining the amplified complementary half-wave rectified pulse-width modulated signal to with an inverse of the amplified half-wave rectified pulse-width modulated signal to generate a second feedback signal on a second output.

7. The circuit of claim 6 wherein the feedback circuit comprises:
   a first resistor having a first terminal coupled to an intermediate node within the first amplifier which provides the inverse of the amplified half-wave rectified pulse-width modulated signal and having a second terminal coupled to the second input of the modulator;
   a second resistor having a first terminal coupled to the first output of the second amplifier which provides the amplified complementary half-wave rectified pulse-width modulated signal and having a second terminal coupled to the second input of the modulator;
   a third resistor having a first terminal coupled to an intermediate node within the second amplifier which provides the inverse of the amplified complementary half-wave rectified pulse-width modulated signal and having a second terminal coupled to the first input of the modulator; and
   a fourth resistor having a first terminal coupled to the first output of the first amplifier which provides the amplified half-wave rectified pulse-width modulated signal and having a second terminal coupled to the first input of the modulator.

8. The circuit of claim 6 wherein the feedback circuit comprises:
   a first inverter having an input terminal coupled to the first output of the first amplifier which provides the amplified half-wave rectified pulse-width modulated signal and having an output terminal which provides the inverse of the amplified half-wave rectified pulse-width modulated signal;
   a second inverter having an input terminal coupled to the first output of the second amplifier which provides the amplified complementary half-wave rectified pulse-width modulated signal and having an output terminal which provides the inverse of the amplified complimentary half-wave rectified pulse-width modulated signal;

a first resistor having a first terminal coupled to the output of a first inverter and having the second terminal coupled to the second input of the modulator;

a second resistor having a first terminal coupled to the first output of the second amplifier and having the second terminal coupled to the second input of the modulator;

a third resistor having a first terminal coupled to the output of the second inverter and having the second terminal coupled to the first input of the modulator; and a fourth resistor having a first terminal coupled to the first output of the first amplifier and having the second terminal is coupled to the first input of the modulator.

9. The circuit of claim 6 wherein the feedback circuit comprises:
a first current inverter having an input terminal and an output terminal;
a second current inverter having an input terminal and an output terminal;
a first resistor network having a first terminal coupled to the first output of the first amplifier which provides the amplified half-wave rectified pulse-width modulated signal and having a second terminal coupled to the input terminal of the first current inverter;
a second resistor network having a first terminal coupled to the first output of the second amplifier which provides the amplified complementary half-wave rectified pulse-width modulated signal and having a second terminal coupled to the second input of the modulator and to the output terminal of the first current inverter;
a third resistor network having a first terminal coupled to the first output of the second amplifier which provides the amplified complementary half-wave rectified pulse-width modulated signal and having a second terminal coupled to the input terminal of the second current inverter; and
a fourth resistor network having a first terminal coupled to the first output of the first amplifier which provides the amplified complementary half-wave rectified pulse width modulated signal and having a second terminal coupled to the first input of the modulator and to the output terminal of the second current inverter.

10. The circuit of claim 9 wherein the first resistor network comprises:
a first resistor having a first terminal coupled to the first output of the first amplifier which provides the amplified half-wave rectified pulse-width modulated signal and having a second terminal;
a second resistor having a first terminal coupled to the second terminal of the first resistor and having the second terminal coupled to a first reference voltage; and
a third resistor having a first terminal coupled to the first terminal of the second resistor and the second terminal of the first resistor and having a second terminal coupled to the input terminal of the first current inverter.

11. The circuit of claim 9 wherein the second resistor network comprises:
a first resistor having a first terminal coupled to the first output of the second amplifier which provides the amplified complimentary half-wave rectified pulse-width modulated signal and having a second terminal coupled to the second input of the modulator; and
a second resistor having a first terminal coupled to the second terminal of the first resistor and to the second input of the modulator, and having a second terminal coupled to a first reference voltage.

12. The circuit of claim 9 wherein the third resistor network comprises:
a first resistor having a first terminal coupled to the first output of the second amplifier which provides the amplified complementary half-wave rectified pulse-width modulated signal and having a second terminal;
a second resistor having a first terminal coupled to the second terminal of the first resistor and having a second terminal coupled to a first reference voltage; and
a third resistor having a first terminal coupled to the first terminal of the second resistor and the second terminal of the first resistor and having a second terminal coupled to the input of the second current inverter.

13. The circuit of claim 9 wherein the fourth resistor network comprises:
a first resistor having a first terminal coupled to the first output of the first amplifier which provides the amplified half-wave rectified pulse-width modulated signal and having a second terminal coupled to the first input of the modulator; and
a second resistor having a first terminal coupled to the second terminal of the first resistor and to the first input of the modulator and having a second terminal coupled to a first reference voltage.

14. The circuit of claim 9 wherein the first current inverter comprises:
a first transistor having a first terminal coupled to the second terminal of the first resistor network and having a control terminal coupled to the second terminal of the first resistor network, and having a second terminal coupled to ground;
a second transistor having a first terminal, having a control terminal coupled to the control terminal of the first transistor, and having a second terminal coupled to ground; and
a first resistor having a first terminal coupled to the first terminal of the second transistor and having a second terminal coupled to the second input of the modulator.

15. The circuit of claim 9 wherein the second current inverter comprises:
a first transistor having a first terminal coupled to the second terminal of the third resistor network and having a control terminal coupled to the second terminal of the third resistor network, and having a second terminal coupled to ground; and
a second transistor having a first terminal, having a control terminal coupled to the control terminal of the first transistor, and having a second terminal coupled to ground; and
a first resistor having a first terminal coupled to the first terminal of the second transistor and having a second terminal coupled to the first input of the modulator.

16. The circuit of claim 6 wherein the first output terminal is coupled to a first integrated circuit package terminal and the second output terminal is coupled to a second integrated circuit package terminal.

* * * * *